United States Patent [19]
Kao

[11] Patent Number: 6,069,500
[45] Date of Patent: May 30, 2000

[54] HIGH SPEED REGENERATION COMPARATOR

[75] Inventor: Hsueh-Wu Kao, Hsinchu Hsien, Taiwan

[73] Assignee: Industrial Technology Research Institute, Hsinchu Hsien, Taiwan

[21] Appl. No.: 09/197,426

[22] Filed: Nov. 23, 1998

[51] Int. Cl.[7] .................................................. H03K 5/153
[52] U.S. Cl. ............................................. 327/77; 327/337
[58] Field of Search .................................. 327/54–56, 63, 327/64, 67, 69–80, 87, 90–91, 93–96, 337, 374, 554; 330/9

[56] References Cited

U.S. PATENT DOCUMENTS

| | | | |
|---|---|---|---|
| 4,691,189 | 9/1987 | Dingwall et al. | 340/347 AD |
| 4,748,418 | 5/1988 | Kerth | 330/9 |
| 4,900,952 | 2/1990 | Hosotani et al. | 327/67 |
| 5,262,686 | 11/1993 | Kurosawa | 327/77 |
| 5,617,044 | 4/1997 | Takamoto | 327/77 |
| 5,936,434 | 8/1999 | Kumamoto et al. | 327/77 |
| 5,973,517 | 10/1999 | Kao | 327/77 |

*Primary Examiner*—My-Trang Nu Ton
*Attorney, Agent, or Firm*—McDermott, Will & Emery

[57] ABSTRACT

A high-speed regeneration comparator is disclosed in the present invention. The high-speed comparator is consisted of two capacitors and two inverters. A first terminal of a first capacitor is coupled with a reference voltage through a first switch and with an inputting voltage through a second switch. The inputting terminal of a first inverter is coupled with a second terminal of the first capacitor and the inputting terminal of the first inverter is coupled with the outputting terminal of the first inverter through a third switch for feedback signals from the outputting terminal of the first inverter to the inputting terminal of the first inverter. A first terminal of a second capacitor is coupled with the outputting terminal of the first inverter. An inputting terminal of the second inverter is coupled with a second terminal of the second capacitor and the outputting terminal of the second inverter is coupled with the inputting terminal of the first inverter through a fourth switch and a fifth switch is coupled with the second inverter in parallel.

10 Claims, 9 Drawing Sheets

6,069,500

HIGH SPEED REGENERATION COMPARATOR

FIELD OF THE INVENTION

The present invention relates to a comparator and in particular to a high-speed regeneration comparator.

BACKGROUND OF THE INVENTION

In the application specific integrated circuit (ASIC) industry, it is desirable to integrate an entire system or subsystem on one integrated circuit chip. The ability to so integrate increases the economy and reliability of the system or subsystem. However, to take advantages of this integration, all the system components are preferably implemented in the same process technology. Such integration becomes a significant problem, for example, in the case of mixed analog and digital system. One way to integrate mixed analog and digital system on one chip is to employ a special process technology for the analog systems in addition to the process technology for the digital portion of the chip. For most ASIC chips, only a small portion of the chip is used for analog circuits while by far the greater portion of the chip is used for digital circuits. Hence, devoting a special process technology for adding analog process modules in the digital process, such as capacitor implants and double poly, is expensive. One solution to the problem is to design certain analog components in the digital process. In this approach, careful circuit design is necessary to overcome the large offset voltages, and unpredictable amplification and lack of a good capacitor in a typical digital technology.

The comparator is a frequently used analog circuit on ASIC chips; for example, it is used in analog to digital converters. Therefore, it is desirable to provide a comparator circuit design that is feasible for implementation in a typical digital technology.

Referring to FIG. 1A, a circuit diagram of a conventional comparator is demonstrated. The comparator in accordance to prior art consists of three inverters, two capacitors and several switches. Moreover, a reference voltage Vref and an inputting voltage Vin are coupled with the comparator and the voltage difference between the voltage sources is amplified. Additionally, the comparator acts as an analog to digital converter. In the following description, the circuit design of the conventional comparator will be explained.

Referring to FIG. 1A, a reference voltage Vref and an inputting voltage Vin are respectively coupled with one terminal of a capacitor 110 through a switch CKvin and a switch CKvref. Moreover, the another terminal of the capacitor 110 is coupled with the inputting terminal of an inverter 120 and the outputting terminal of the inverter 120 is coupled with one terminal of a capacitor 130. Meanwhile, the outputting terminal of the inverter 120 is coupled with the inputting terminal of it through a switch az1. Then, the another terminal of the capacitor 130 is coupled with the inputting terminal of an inverter 140 and the outputting terminal of the inverter 140 is coupled with the inputting terminal of an inverter 150. Meanwhile, the outputting terminal of the inverter 140 is coupled with the inputting terminal of it through a switch az2. Finally, an outputting voltage Vout is output from the outputting terminal of the inverter 150.

Thus, two voltage sources are input into the comparator according to FIG. 1A. After that, the voltage difference between both of the voltage sources is amplified and the amplified voltage difference is output from the outputting terminal of the comparator. Consequently, two analog signals are input into the inputting terminal of the comparator and one digital signals is output from the outputting terminal of the comparator. That is, the comparator is used as an analog to digital converter.

Referring to FIG. 1B, it is demonstrated that a timing diagram of clock signals for operating the switches in the conventional comparator according to FIG. 1A. It is supposed that the switches in FIG. 1A are NMOS transistors. As a high-level voltage is applied on the gate of an NMOS transistor, it will be turned on. Similarly, as a low-level voltage is input into the gate of an NMOS transistor, it will be turned off.

Referring to FIG. 1B, the switch az1, the switch az2 and the switch CKvin are turned on and the switch CKvref is simultaneously turned off. After that, the reference voltage Vref is input into the capacitor 110. Therefore, a voltage level is maintained in the capacitor 110 and it is equal to the voltage level of the inputting voltage Vin minus the threshold voltage Vth of the inverter 120. At the same time, the inverter 120 receives an negative feedback from the outputting terminal to the inputting terminal through the switch az1 and the inverter 140 receives an negative feedback through the switch az2, too.

Referring to FIG. 1B, after the capacitor is charged by the voltage source Vin, the switch az1 is firstly turned off. The switch az2 and the switch CKvin are then turned off and the switch CKvref is simultaneously turned on. Meanwhile, the reference voltage Vref is input into the capacitor 110 and the voltage at the input of the inverter 120 is equal to the voltage Vth+Vref−Vin. Subsequently, the voltage difference is amplified by the inverters 120, 140 and 150. Additionally, the capacitor 130 is used to save the offset of the inverter 120 and the inverter 140.

Referring to FIG. 1B, there have two phases for operating the switches in the timing diagram of clock signals. The phase A is a sampling period for charging the capacitor 110 by the inputting voltage Vin and the phase B is a comparing period for determining the voltage difference between the inputting voltage Vin and the reference voltage Vref.

A voltage comparison performed in a conventional comparator takes long time and the gain of the conventional comparator need very large. For a high gain of a comparator, the channel length of the inverter must be lengthened, but it slows the speed of the comparator down. It will be a trend that the size of integrated circuits scales down. However, as the size of a comparator is scaled down, the channel length of it should not be shortened in order to get a high gain. Therefore, a high-speed comparator without a long channel length is needed for high-density integrated circuits.

SUMMARY OF THE INVENTION

A high-speed regeneration comparator is disclosed in the present invention. The high-speed comparator is consisted of two capacitors and two inverters. A first terminal of a first capacitor is coupled with a reference voltage through a first switch and with an inputting voltage through a second switch. The inputting terminal of a first inverter is coupled with a second terminal of the first capacitor and the inputting terminal of the first inverter is coupled with the outputting terminal of the first inverter through a third switch for feedback signals from the outputting terminal of the first inverter to the inputting terminal of the first inverter. A first terminal of a second capacitor is coupled with the outputting terminal of the first inverter. An inputting terminal of the second inverter is coupled with a second terminal of the second capacitor and the outputting terminal of the second inverter is coupled with the inputting terminal of the first inverter through a fourth switch and a fifth switch is coupled with the second inverter in parallel.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The present invention discloses a high-speed comparator having a high gain. The high-speed comparator is consisted of two inverters and two capacitors. The first capacitor is coupled with two voltage sources and it serves as a charge-storage device. A first inverter is coupled with one terminal of the first capacitor for amplifying the signals difference of Vin and Vref. A second capacitor and a second inverter, which are coupled together in series, are coupled with the first inverter in parallel for passing a positive feedback. Moreover, the second capacitor acts to store offset of the inverter 220 and the inverter 240. The high-speed comparator in the present invention has a high gain, because of positive feedback. As the size of the high-speed comparator is scaled down, the gain of it would not be lowered.

Figure 1A:
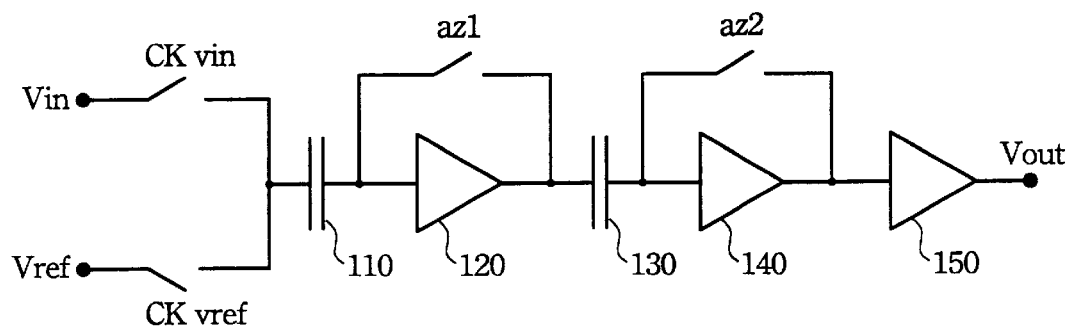
FIG. 1A shows a schematic circuit diagram of a comparator comprising several inverters in accordance with prior art.
Figure 1B:
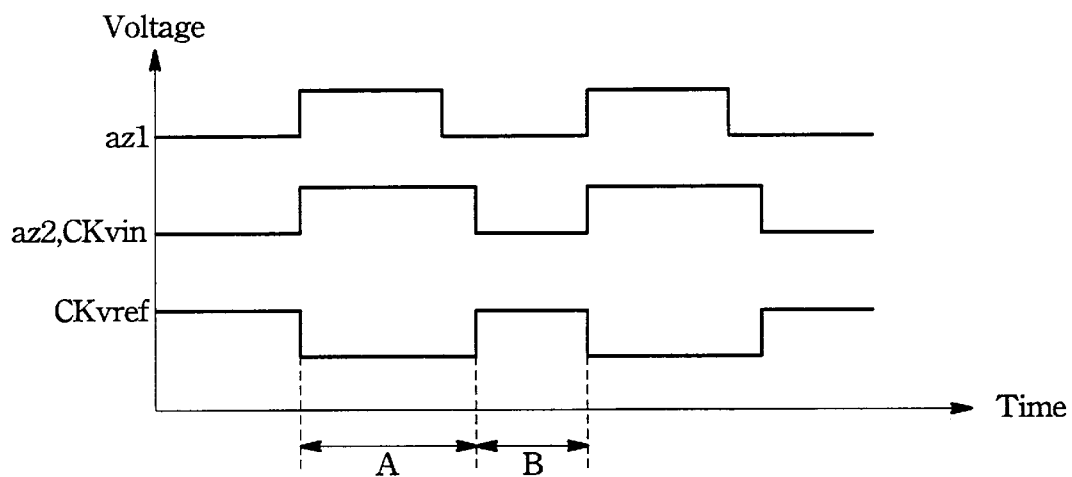
FIG. 1B shows a timing diagram of clock signals for operating the circuit according to FIG. 1A.
Figure 2A:
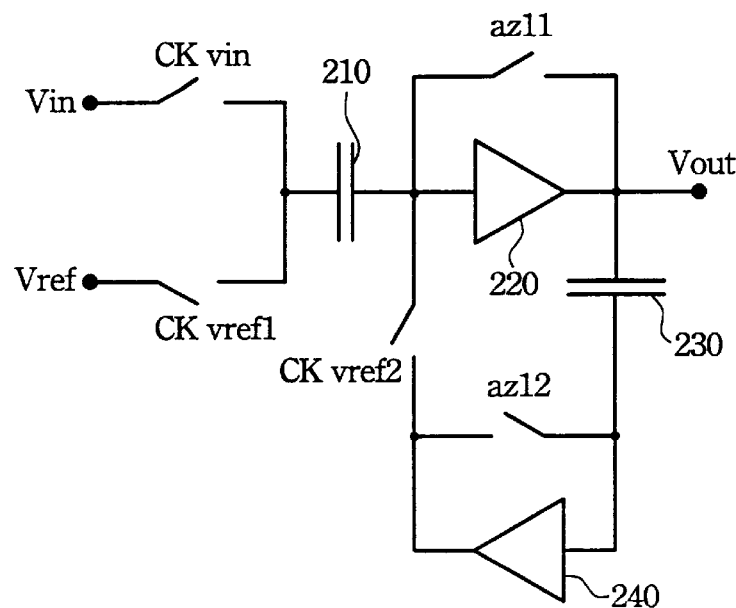
FIG. 2A shows a schematic circuit of a comparator in accordance with the present invention.

Referring to FIG. 2A, it is demonstrated that a circuit diagram of a high-speed comparator without a long channel length is used in the present invention. Moreover, the comparator is used for the voltage comparison between a reference voltage and an inputting voltage. A reference voltage Vref and an inputting voltage Vin are respectively connected with a terminal of a capacitor 210 through a switch CKvref1 and a switch CKvin. Besides, the another terminal of the capacitor 210 is connected with the inputting terminal of an inverter 220. Furthermore, the outputting terminal of the inverter 220 is connected with the inputting terminal of the inverter 220 through a switch az11 for passing a negative feedback to the inputting terminal of it. In addition, the outputting terminal of the inverter 220 is connected with a terminal of a capacitor 230 and the another terminal of the capacitor 230 is connected with the inputting terminal of an inverter 240. Subsequently, the outputting terminal of the inverter 240 is connected with the inputting terminal of the inverter 220 through a switch CKvref2 for passing a positive feedback. Besides, a switch az12 is coupled with the inverter 240 in parallel. As two voltage sources are coupled with the comparator, a voltage level Vout is output from the outputting terminal of the inverter 220. In the following description, it is explained that the switches in the comparator are how to operate according to a timing diagram of clock signals.

Figure 2B:
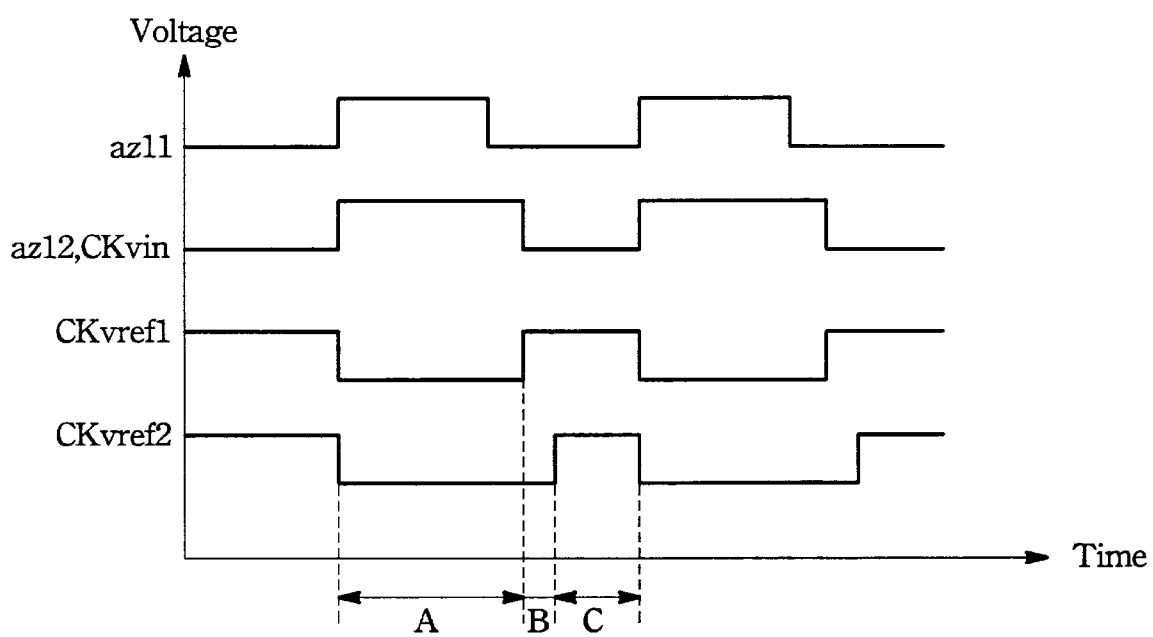
FIG. 2B shows a timing diagram of clock signals for operating the comparator in FIG. 2A.

Referring to FIG. 2B, the sequence for operating the switches in the comparator is shown. The switch az11, the switch az12 and the switch CKvin are turned on. Moreover, the switch CKvref1 and the switch CKvref2 are simultaneously turned off. During this phase, the inputting voltage Vin is input into the capacitor 210 and the voltage level in it is maintained at Vin minus Vth. It is noted that the voltage level Vth is the selfbiased voltage of the inverter 220 when the inverter's output is connected to its input terminal. Therefore, the phase for charging the capacitor 210 is indicated as a sampling period.

Still referring to FIG. 2B, after the charging of the capacitor 210, the switch az11 is firstly turned off. Then, the switch az12 and the switch CKvin are turned off, the switch CKvref1 is simultaneously turned on. Meanwhile, the reference voltage Vref is input into the capacitor 210 and the voltage level at the input terminal of the inverter 220 is equal to Vref+Vth−Vin. The phase is called as a comparing phase. After the short comparing period, the switch CKvref2 is turned on for passing a positive feedback from the outputting terminal of the inverter 220 to the inputting terminal of it through the capacitor 230 and the inverter 240. In the present invention, the capacitor 230 acts as a offset storer of the inverter 220 and the inverter 240. The period to turn on the switch CKvref2 is indicated as a third phase for amplifying the voltage difference between the inputting voltage and the reference voltage Vref through a positive feedback. When the third phase finishes, the switch az11, the switch az12 and the switch CKvin are turned on, the switch CKvref1 and the switch CKvref2 are simultaneously turned off. After that, the voltage-difference comparison between two voltage sources will be performed again. The third phase is needed to make sure the positive feedback is right to gain a correct result.

Figure 3:
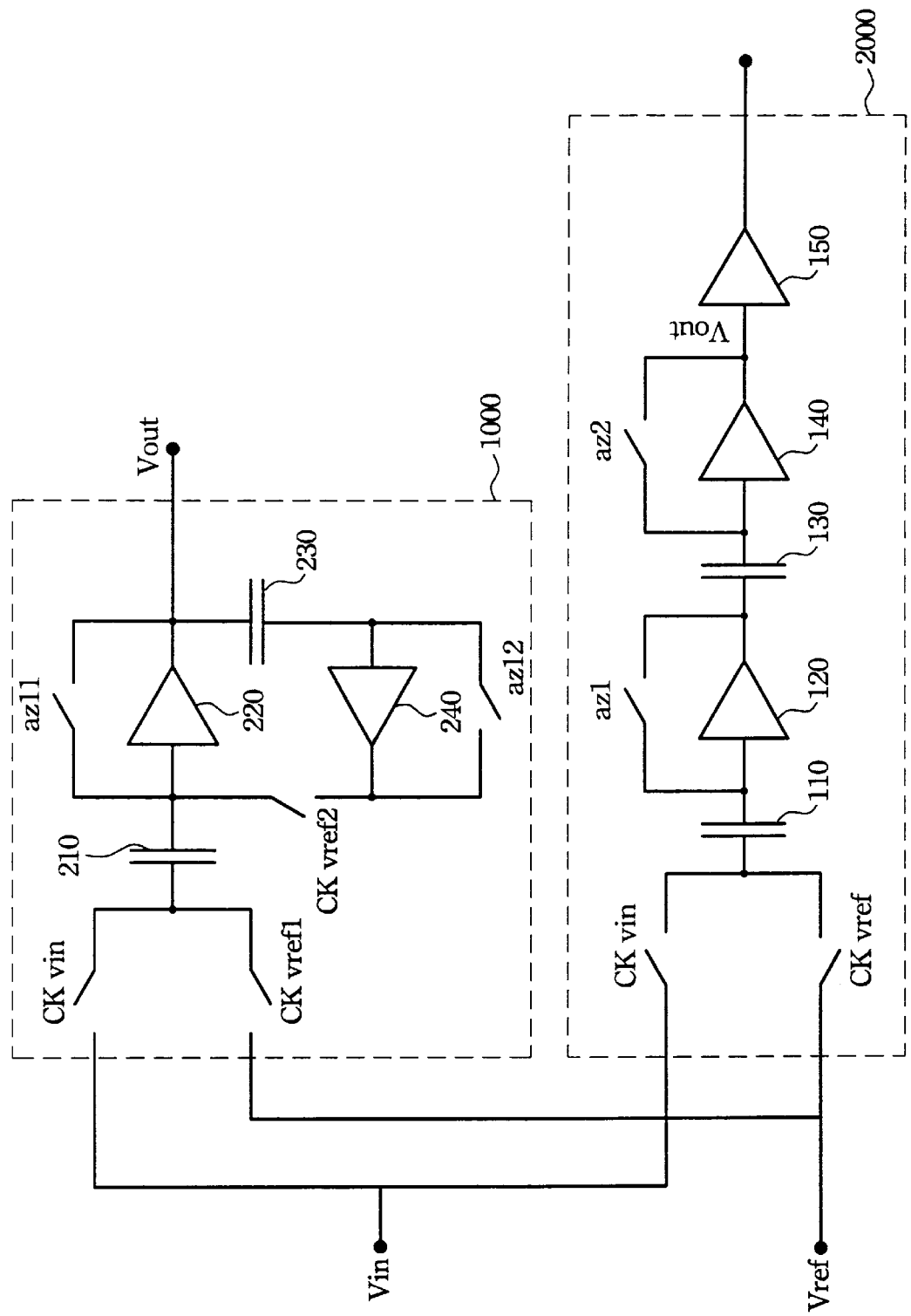
FIG. 3 demonstrates a schematic circuit diagram of a comparator in accordance to the present invention and a comparator in accordance to prior art.

Turning to FIG. 3, a schematic circuit diagram of a comparator 1000 and a comparator 2000 is demonstrated. A reference voltage Vref and an inputting voltage Vin are input into the comparator 1000 and the comparator 2000. Each of the comparator 1000 and the comparator 2000 output a voltage level Vout. By using the design according to FIG. 3, a speed comparison between the comparator 1000 and 2000 is performed. The inputting and outputting signals of the comparators are demonstrated in FIGS. 4A to 4D.

Figure 4A:
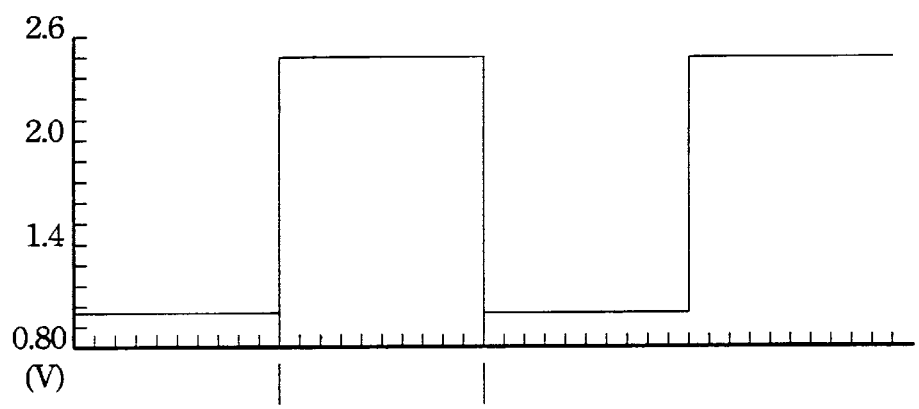
FIGS. 4A to 4D demonstrate four voltage-time diagrams for the speed comparison between the comparators of the prior art and the present invention by varying the inputting voltage from 1 volt to 2.501 volts.
Figure 4B:
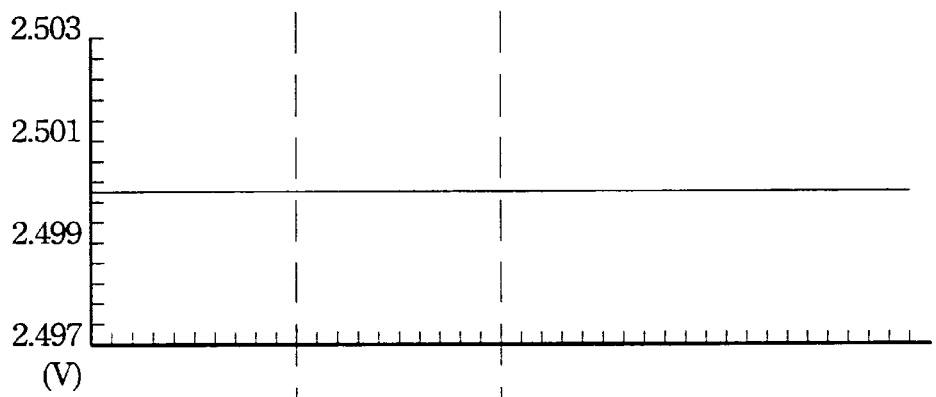
Figure 4C:
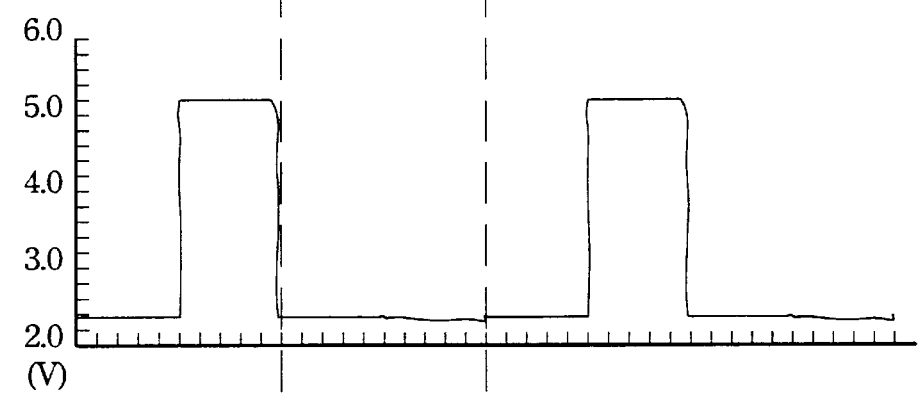
Figure 4D:
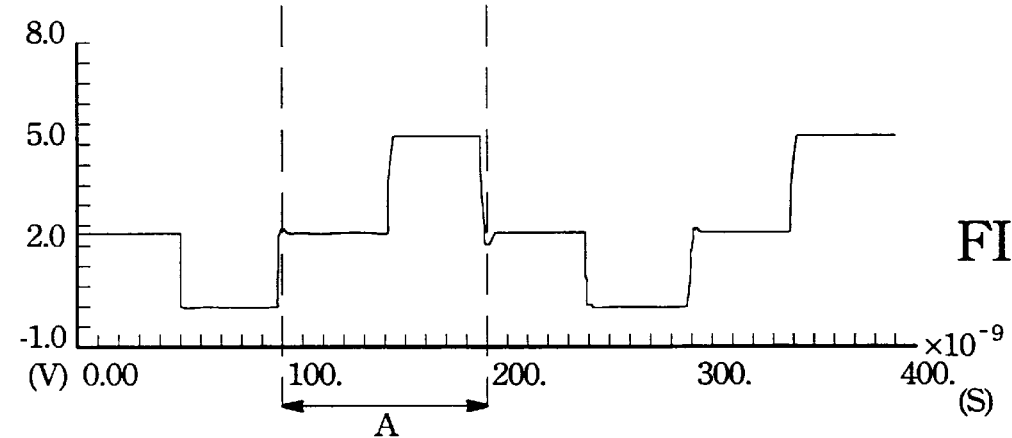

The following comparison is performed by using specified inverters. Every inverter has a p-channel MOS and an n-channel MOS device. The channel length of the MOS deivces is about 2 micron meters. Moreover, the channel width of the n-channel devices is about 2.5 micron meters and that of the p-channel devices is about 5 micron meters. This is for biasing $Vth=½*V_{DD}$ Referring to FIG. 4A, a voltage level of the inputting voltage Vin is shown. The inputting voltage Vin is maintained at about 1 volt and it is lifted to 2.501 volts in a period A. Moreover, the reference voltage Vref is always maintained at 2.5 volts, as shown in FIG. 4B. Thus, the voltage difference between the inputting voltage Vin and the reference voltage Vref is varied from 1.5 volts to 0.001 volts. And this is an overdrive simulation. That is, the voltage difference is rapidly varied. Referring to FIG. 4C and FIG. 4D, voltage levels that are output from the comparator 1000 and the comparator 2000 are respectively demonstrated. At the beginning of the period A, the inputting voltage rapidly varies. Meanwhile, the outputting voltage level from the comparator 1000 slowly varies and that output from the comparator 2000 rapidly varies. Therefore, as the voltage difference between the two voltage sources is rapidly decreased, it is still fastly amplified by using the comparator 2000.

Figure 5A:
FIGS. 5A to 5D demonstrate four voltage-time diagrams for speed comparison between the comparators of the prior art and the present invention by varying the inputting voltage from 5 volts to 2.499 volts.
Figure 5B:
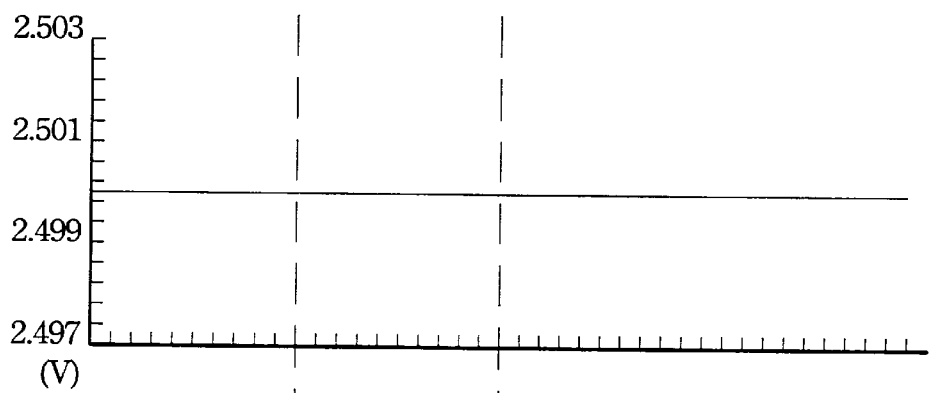
Figure 5C:
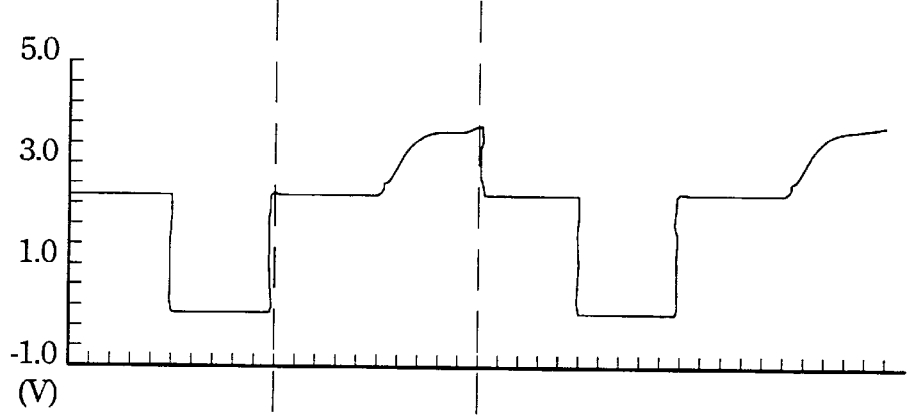
Figure 5D:
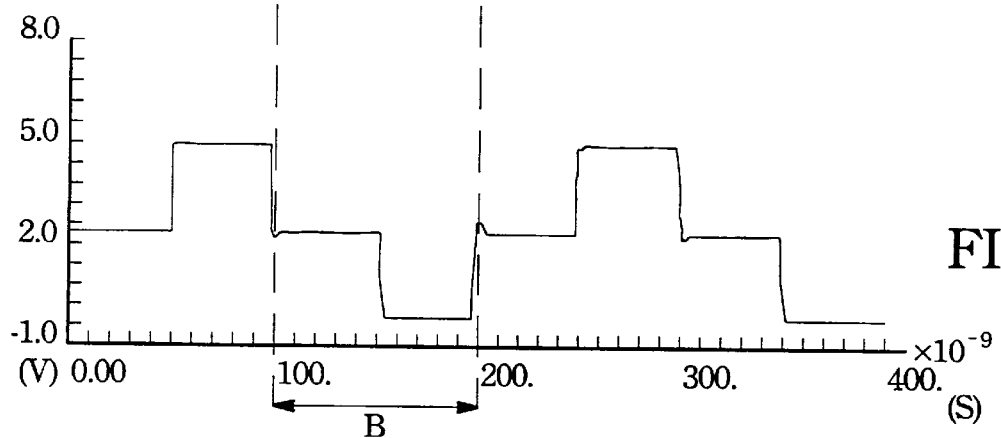

Referring to FIG. 5A, the inputting voltage Vin is maintained at the voltage level at about 5 volts and it is then decreased to about 2.499 volts. Furthermore, the reference voltage Vref is always maintained at 2.5 volts, as shown in FIG. 5B. At the beginning of a period B according to FIG. 5A to FIG. 5D, the voltage difference between the inputting voltage Vin and the reference voltage Vref is rapidly decreased from 2.5 volts to 0.001 volts. This is another overdrive simulations. Meanwhile, the voltage level outputting from the comparator 1000 is slowly increased and that from the comparator 2000 is rapidly decreased, as shown in FIGS. 5C and 5D. Consequently, the comparison speed of the comparator 2000 is faster than that of the comparator 1000.

In the following description, a speed comparison is performed again. The device design in the comparators is different to that in the above comparators. The length channel of the MOS devices is about 0.5 micron meters. The channel width of n-channel MOS device in the comparator is about 1 micron meters and that of p-channel MOS device is about 2.5 mircon. Therefore, the size of the devices used in the second comparison is smaller than that in the first comparison.

Figure 6A:
FIGS. 6A to 6E show five voltage-time diagrams for speed comparison between the comparators of the prior art and the present invention by varying the inputting voltage from 2.501 volts to 1 volt.
Figure 6B:
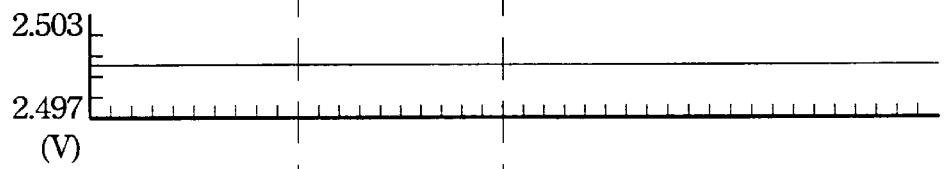
Figure 6C:
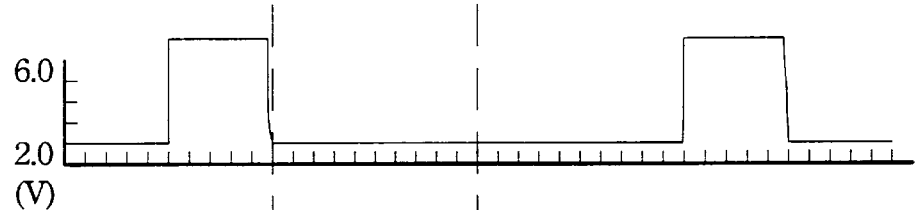
Figure 6D:
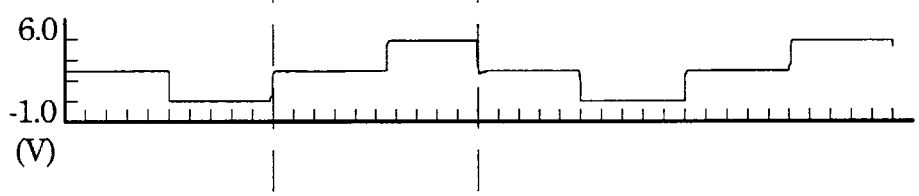
Figure 6E:
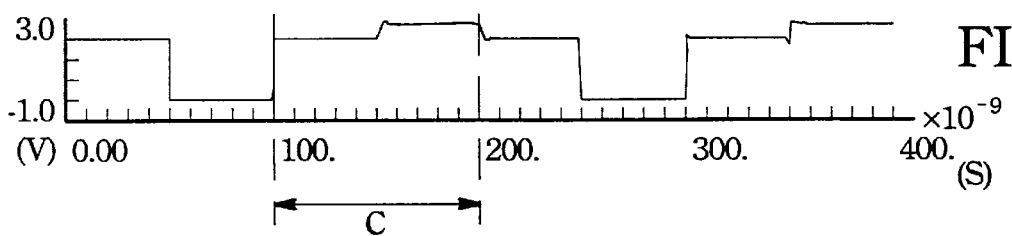

Referring to FIG. 6A, the inputting voltage Vin is increased from 1 volt to 2.501 volts at the beginning of the period C. The reference voltage is maintained at the 2.5 volts, as shown in FIG. 6B. That is, the voltage difference between the reference voltage and the inputting voltage Vin is rapidly decreased from 1.5 volts to 0.001 volt. Referring to FIG. 6C, the outputting voltage level from the comparator 1000 during the period C is almost not varied. Even through one more inverter's amplification, the result in FIG. 6E show that the gain is not enough. As shown in FIG. 6D, the outputting voltage level from the comparator 2000 is rapidly increased during the period C. Therefore, as the size of the comparator 1000 is scaled down, the voltage difference between the inputting voltage Vin and the reference voltage Vref is not significantly amplified due to the low gain of the comparator. In contrast, as the size of the comparator 2000 is scaled down, the voltage difference is apparently amplified in the comparator 2000. Therefore, the scale down of the comparator in the present invention do not influent the amplified gain of the voltage difference.

Figure 7A:
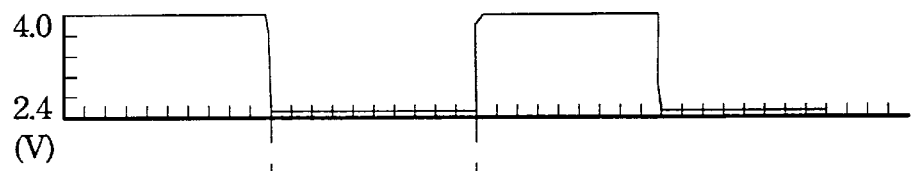
FIGS. 7A to 7D show four voltage-time diagrams for speed comparison between the comparators of the prior art and the present invention by varying the inputting voltage from 5 volts to 2.499 volts.
Figure 7B:
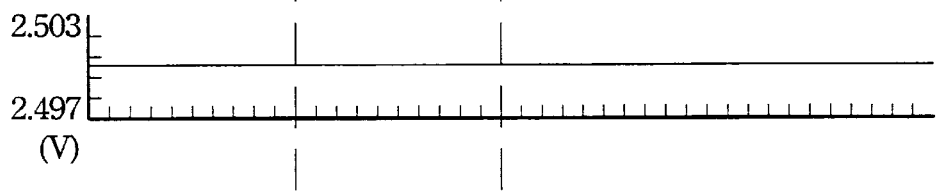
Figure 7C:
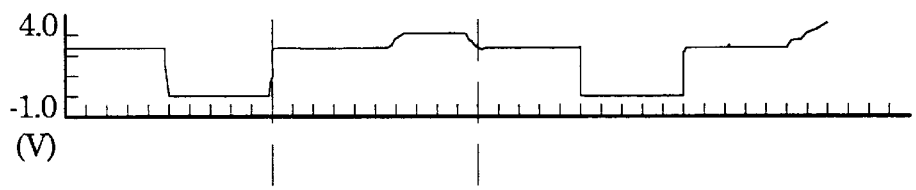
Figure 7D:
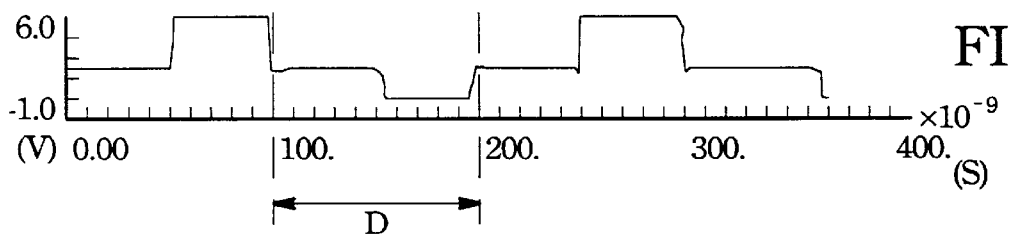

Referring to FIG. 7A, an inputting voltage Vin is decreased from 4 volts to 2.499 volts. The reference voltage Vref is maintained at the voltage level at about 2.5 volts, as shown in FIG. 7B. Consequently, the voltage difference between the inputting voltage Vin and the reference voltage Vref is varied from 1.5 volts to 0.001 volts. Referring to FIG. 7C, the outputting voltage of the comparator 1000 is slowly increased during the period D. Referring to FIG. 7D, the outputting voltage of the comparator 2000 is rapidly decreased during the period D. Thus, as the inputting voltage Vin is rapidly decreased in order to decrease the voltage difference, the small-size comparator of the present invention has a higher gain and a faster speed than that of the prior art.

Figure 8:
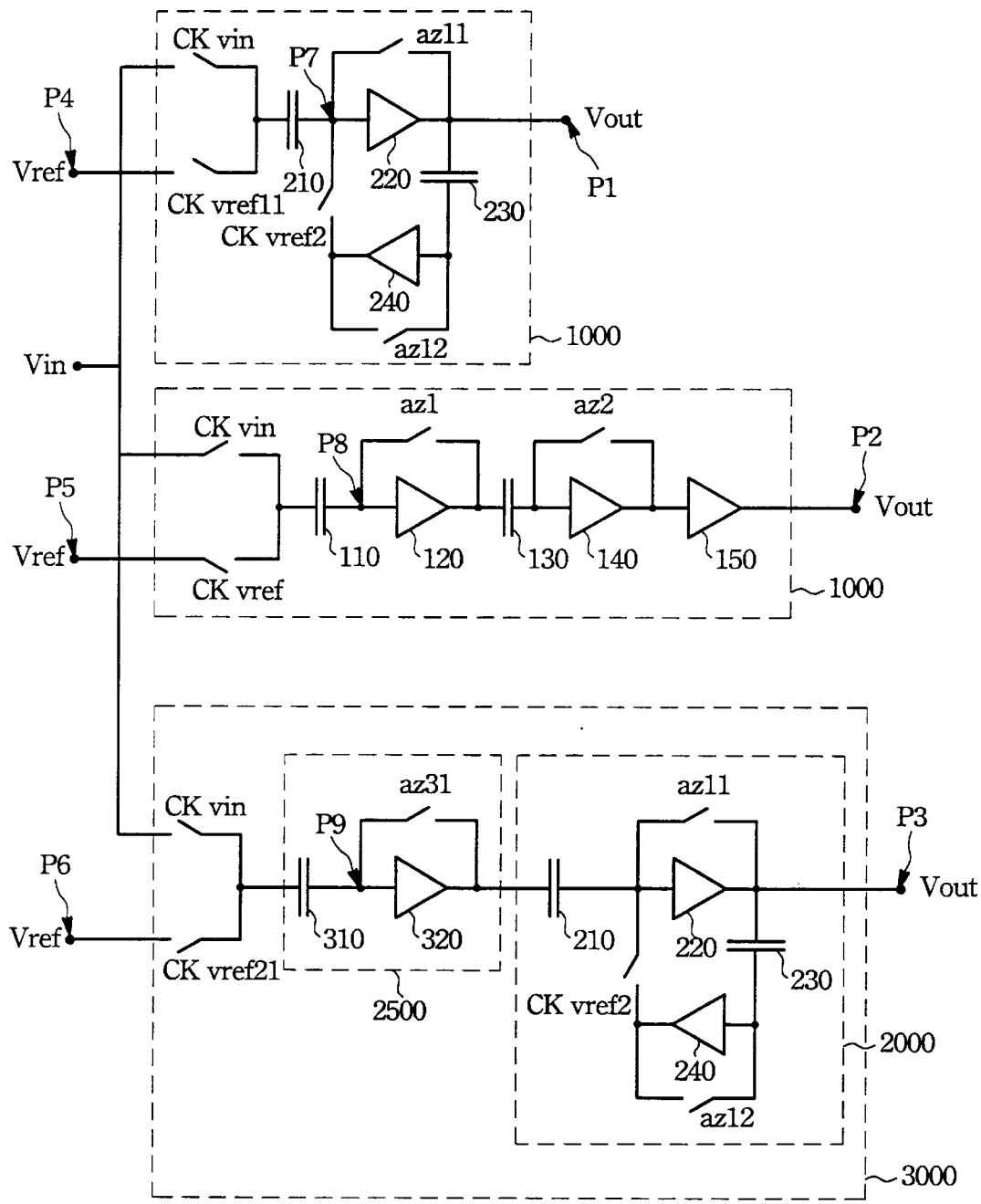
FIG. 8 shows a schematic circuit diagram of three comparators in accordance to the prior art, a first embodiment of the present invention and a second embodiment of the present invention.

Referring to FIG. 8, the circuit design of three comparators are demonstrated and there are a comparator 1000, a comparator 2000 and a comparator 3000. The design of the comparator 1000 and the comparator 2000 is explained in the above description. The comparator 3000 is consisted of a comparator 2000 and a buffer circuit 2500. Besides, the buffer circuit 2500 is consisted of a capacitor 310 and an inverter 320. An inputting voltage Vin and a reference voltage Vref are coupled with a terminal of the capacitor 310 and the another terminal of the capacitor 310 is coupled with the inputting terminal of the inverter 320. The outputting terminal of the inverter 320 is coupled with the inputting terminal of it through a switch az31. Moreover, the outputting terminal of the inverter 320 is coupled with the comparator 2000 in the comparator 3000.

Still referring to FIG. 8, an inputting voltage Vin and a reference voltage Vref are input into the comparator 1000, 2000 and 3000 at the same time. The voltage level of several points in the circuit according to FIG. 8 is detected.

Figure 9A:
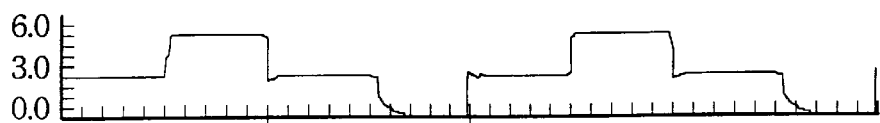
FIGS. 9A to 9F show schematic voltage-time diagrams for speed comparison between the three comparators in FIG. 8.

Referring to FIGS. 9A to 9F, at the beginning of the period E, the inputting voltage is rapidly varied and the reference voltage is maintained at constant. Referring to FIG. 9A, the voltage level of the point P1 in FIG. 8 is shown and it rapidly decreased during the period E. It means that the comparator 2000 has a high gain for amplifying the voltage difference between the inputting voltage and the reference voltage.

Figure 9B:
Figure 9C:
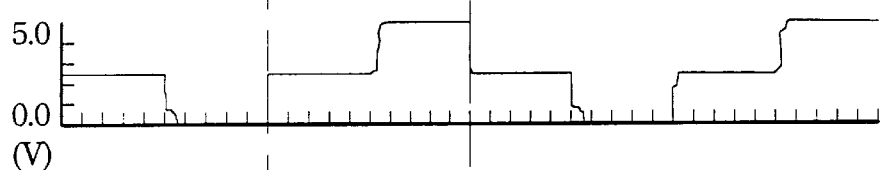
Figure 9D:
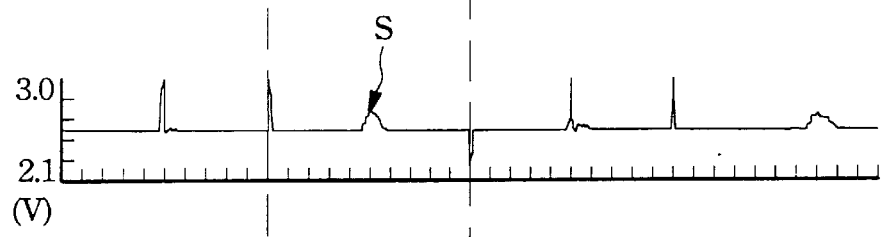
Figure 9E:
Figure 9F:
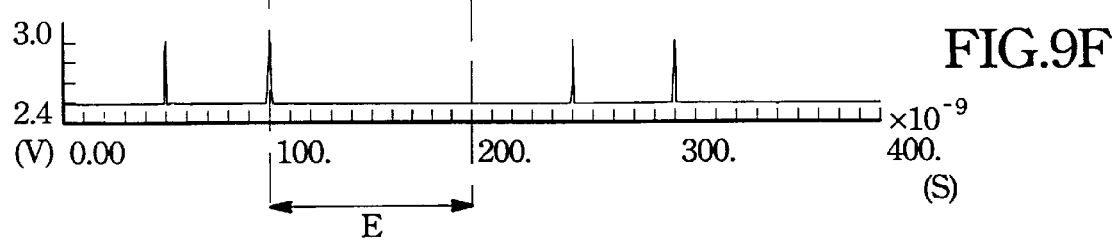

Referring to FIG. 9B, the voltage level at the point P2 in FIG. 8 somewhat slowly varies during the period E. Referring to FIG. 9B, the voltage level at the point P3 in FIG. 8 is rapidly varied. The voltage levels at the point P4, P5 and P6 are respectively demonstrated in FIGS. 9D, 9E and 9F. During the period E, the voltage level at point P4 has a to spike S due to positive feedback. An unnormal positive feedback will not pass back the inverters of the comparator 3000 for preventing from that the reference voltage is affected. That means that the feedback from the comparator 2000 affects the reference voltage source whether buffer stage need or not, mostly depending on the resolution and speed of the comparator that is needed.

Therefore, a buffer circuit that is similar to the comparator according to the prior art is inserted between the comparator 2000 and the voltage sources. Therefore, the comparator 3000 should be indicated as a modified embodiment of the comparator 2000 in the present invention.

While the preferred embodiment of the invention has been illustrated and described, it will be appreciated that various changes can be made therein without departing from the spirit and scope of the invention.

What is claimed is:

1. A regeneration comparator, said comparator comprises:
   a first capacitor, a first terminal of said first capacitor coupled with a reference voltage through a first switch and with an inputting voltage through a second switch;
   a first inverter, an inputting terminal of said first inverter coupled with a second terminal of said first capacitor and said inputting terminal of said first inverter coupled with an outputting terminal of said first inverter through a third switch for feedback signals from said outputting terminal of said first inverter to said inputting terminal of said first inverter;

a second capacitor, a first terminal of said second capacitor coupled with said outputting terminal of said first inverter; and a second inverter, an inputting terminal of said second inverter coupled with a second terminal of said second capacitor and an outputting terminal of said second inverter directly coupled with said inputting terminal of said first inverter through a fourth switch and a fifth switch coupled with said second inverter in parallel.

2. The comparator according to claim 1, wherein said first capacitor is indicated as a charge storage device.

3. The comparator according to claim 1, wherein said second capacitor is indicated as a offset storer.

4. A regeneration comparator, said comparator comprises:

a first charge-storage device, a first terminal of said first charge-storage device respectively coupled with an inputting voltage and a reference voltage through a first switch and a second switch;

a first inverter, an inputting terminal of thereof coupled with a second terminal of said first charge-storage device and an outputting terminal of said first inverter coupled with said inputting terminal of said first inverter through a third switch;

a second charge-storage device, a first terminal of thereof coupled with said outputting terminal of said first inverter;

a second inverter, an inputting terminal of thereof coupled with a second terminal of said second charge-storage device and an outputting terminal of said second inverter coupled with said inputting terminal of said second inverter through a fourth switch; and a third inverter, an inputting terminal of thereof coupled with said outputting terminal of said second inverter through a capacitor which acts as an offset storer and an outputting terminal of said third inverter coupled with said inputting terminal of said second inverter through a fifth switch and a sixth switch coupled with said third inverter in parallel, wherein an outputting signal is output from said outputting terminal of said second inverter.

5. The comparator according to claim 4, wherein said first charge-storage device comprises a capacitor.

6. The comparator according to claim 4, wherein said second charge-storage device comprises a capacitor.

7. The comparator according to claim 4, wherein said first inverter passes a feedback from said outputting terminal of thereof to said inputting terminal of thereof through said third switch.

8. The comparator according to claim 4, wherein said second inverter passes a feedback from said outputting terminal of thereof to said inputting terminal of thereof through said fourth switch.

9. The comparator according to claim 4, wherein said second inverter passes a positive feedback from said outputting terminal of said second inverter to said inputting terminal of said second inverter through said offset storer and said third inverter.

10. The comparator according to claim 4, wherein said buffer stage prevents said reference voltage from interferences of positive feedback at the case which need high resolution and high speed comparison.

* * * * *